United States Patent [19]

Tahara et al.

[11] Patent Number: 5,781,572
[45] Date of Patent: Jul. 14, 1998

[54] OPTICAL WAVELENGTH STABILIZING SYSTEM

[75] Inventors: Yoko Tahara; Yoshinori Ohkuma; Masaru Onishi; Toshiyuki Masuko, all of Kawasaki, Japan

[73] Assignee: Fujitsu Limited, Kanagawa, Japan

[21] Appl. No.: 643,491

[22] Filed: May 6, 1996

[30] Foreign Application Priority Data

Oct. 25, 1995  [JP]  Japan ................... 7-277366

[51] Int. Cl.$^6$ ................................. H01S 3/04
[52] U.S. Cl. ........................................ 372/34
[58] Field of Search ....................... 372/34, 36, 38

[56] References Cited

U.S. PATENT DOCUMENTS

| | | | |
|---|---|---|---|
| 4,737,798 | 4/1988 | Lonis et al. | 372/34 |
| 4,821,273 | 4/1989 | Hori | 372/34 |
| 4,955,029 | 9/1990 | Lecoy et al. | 372/38 |
| 5,042,042 | 8/1991 | Hori et al. | 372/34 |
| 5,313,480 | 5/1994 | Fidric et al. | 372/34 |
| 5,577,059 | 11/1996 | Lee et al. | 372/34 |

Primary Examiner—Rodney B. Bovernick
Assistant Examiner—Robert E. Wise
Attorney, Agent, or Firm—Helfgott & Karas, P.C.

[57] ABSTRACT

An optical wavelength stabilizing system including a laser diode for emitting signal light, a Peltier element for controlling a temperature of the laser diode, and a drive circuit for driving the Peltier element. The signal light is branched into two components by an optical coupler. In an optical path of one of the two components obtained by the optical coupler, there is inserted an optical filter having a portion whose transmittance continuously changes according to wavelength. The signal light component passed through the portion of the optical filter is detected by a photodetector. An output current from the photodetector is converted into a voltage, which is then input into a comparator. The comparator compares the voltage output from the photodetector and a reference voltage to input a voltage difference therebetween into the drive circuit.

10 Claims, 11 Drawing Sheets

F I G. 5
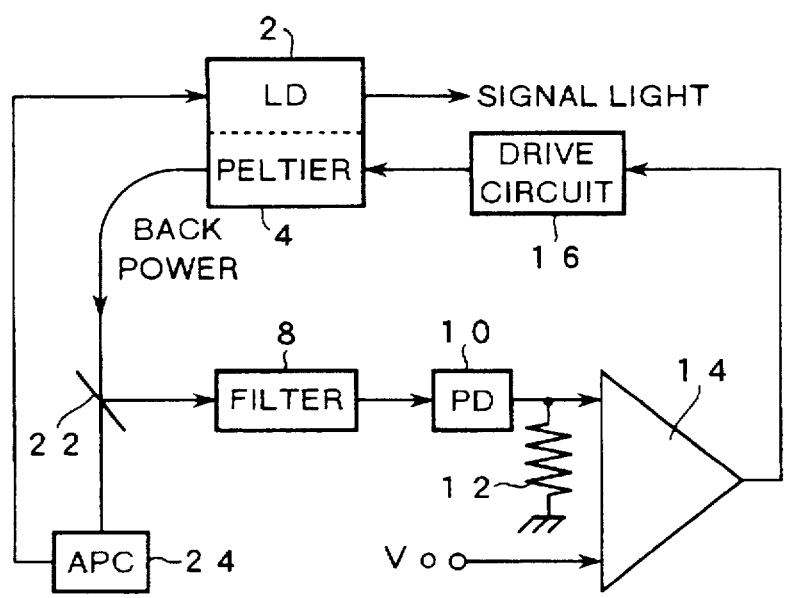

OPTICAL WAVELENGTH STABILIZING SYSTEM

BACKGROUND OF THE INVENTION

1. Field of the Invention

The present invention relates to an optical wavelength stabilizing system for stabilizing the emission wavelength (oscillation wavelength) of a laser diode.

2. Description of the Related Art

An optical amplifier has a characteristic of not only amplifying light having a required wavelength band, but also undesirably amplifying light having a wavelength band other than the required wavelength band. Such unrequited light becomes a noise component of signal light to invite the degradation of an S/N (signal-to-noise ratio) of the signal light, causing a degradation in received signal level or an error rate floor. To solve this problem, an optical wavelength filter is conventionally provided on the post-stage of the optical amplifier to thereby prevent the S/N degradation. While the narrower the bandwidth of signal light, the more effectively the optical wavelength filter can cut off unrequired light, it is necessary to make the center wavelength of a laser and the center wavelength of the optical wavelength filter accurately coincide with each other.

As a method of stabilizing a laser wavelength, it is considered to improve the accuracy of a laser diode (LD). However, since the improvement in the accuracy of the LD invites an increase in cost, there have been proposed other methods in which variations in the accuracy of the LD are permitted to some extent and the emission wavelength of the LD is stabilized by external means. One of such methods known in the art is an automatic temperature control method (ATC method) in which a change in temperature of an LD chip having an influence on the emission wavelength of the LD is suppressed by detecting the temperature of the LD chip with a thermistor, driving a Peltier element according to the temperature detected, and thereby maintaining the temperature of the LD chip at a constant value. Another conventional method is an automatic current control method (ACC method) in which a drive current to a laser diode is controlled to stabilize the emission wavelength of the LD.

However, in the above-mentioned conventional methods, the emission wavelength of the laser is not directly detected. Accordingly, in the typical case that (1) the stability of an ATC circuit is low, (2) the stability of an LD drive current is low, or (3) the emission wavelength of the LD is shifted because of LD degradation even though the LD chip temperature is constant, there occurs a degradation in received signal level due to S/N degradation, and in the worst case, optical communications may be broken down.

SUMMARY OF THE INVENTION

It is therefore an object of the present invention to provide an optical wavelength stabilizing system which can maintain the emission wavelength of a laser diode at a desired value.

In accordance with an aspect of the present invention, there is provided an optical wavelength stabilizing system comprising a laser diode for emitting signal light; a Peltier element for controlling a temperature of the laser diode; a driving means for driving the Peltier element; an optical branching means for branching the signal light into two components; an optical filter inserted in an optical path of one of the two components obtained by the optical branching means, the optical filter having a portion whose transmittance continuously increases or decreases according to wavelength; a photodetector for detecting the one component passed through the portion of the optical filter; a converting means for converting a current output from the photodetector into a voltage; and a comparator for comparing the voltage obtained by the converting means and a reference voltage to output a voltage difference between the voltage and the reference voltage to the driving means.

The above configuration may be modified by inputting back power light output from the laser diode into the optical filter.

In accordance with another aspect of the present invention, there is provided an optical wavelength stabilizing system comprising a laser diode for emitting signal light; a Peltier element for controlling a temperature of the laser diode; a driving means for driving the Peltier element; a first optical branching means for branching the signal light into two components; a second optical branching means for branching one of the two components obtained by the first optical branching means into two components; a first optical filter inserted in an optical path of one of the two components obtained by the second optical branching means, the first optical filter having a portion whose transmittance continuously increases according to wavelength; a second optical filter inserted in an optical path of the other of the two components obtained by the second optical branching means, the second optical filter having a portion whose transmittance continuously decreases according to wavelength; a first photodetector for detecting the one component passed through the portion of the first optical filter; a second photodetector for detecting the other component passed through the portion of the second optical filter; and a comparator for comparing an output from the first photodetector and an output from the second photodetector to output a differential signal to the driving means.

The above configuration may be modified by inputting the output from the comparator into a driving means for driving the laser diode to drive the laser diode according to the outputs from the first and second photodetectors. Alternatively, a driving means for driving a phase control region in the laser diode may be provided, and the output from the comparator may be input into the driving means. Further, the system may be configured so that back power light from the laser diode is input into the first and second optical filters.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIG. 5 is a block diagram of a second preferred embodiment of the present invention;

3

Figure 7:
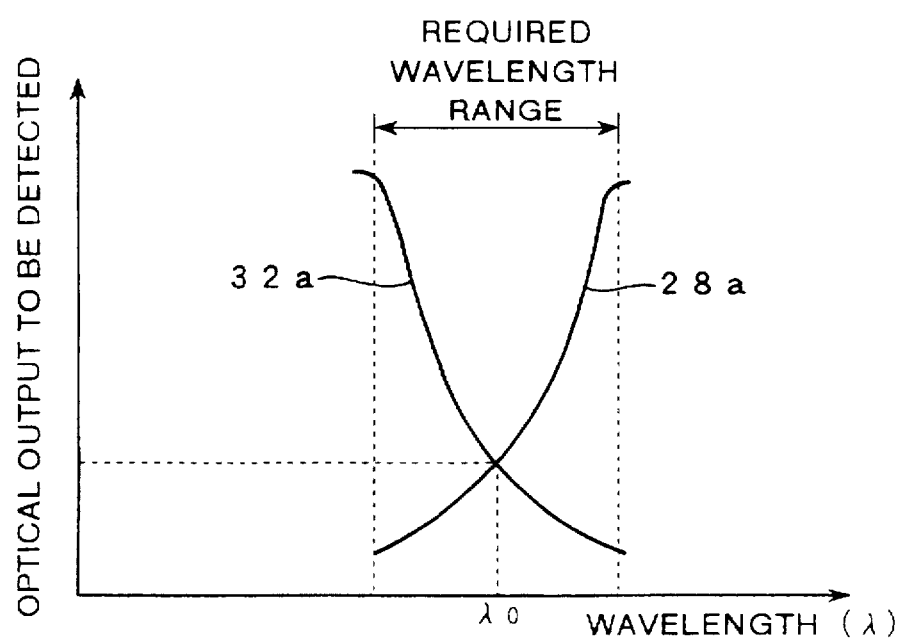
Figure 8:
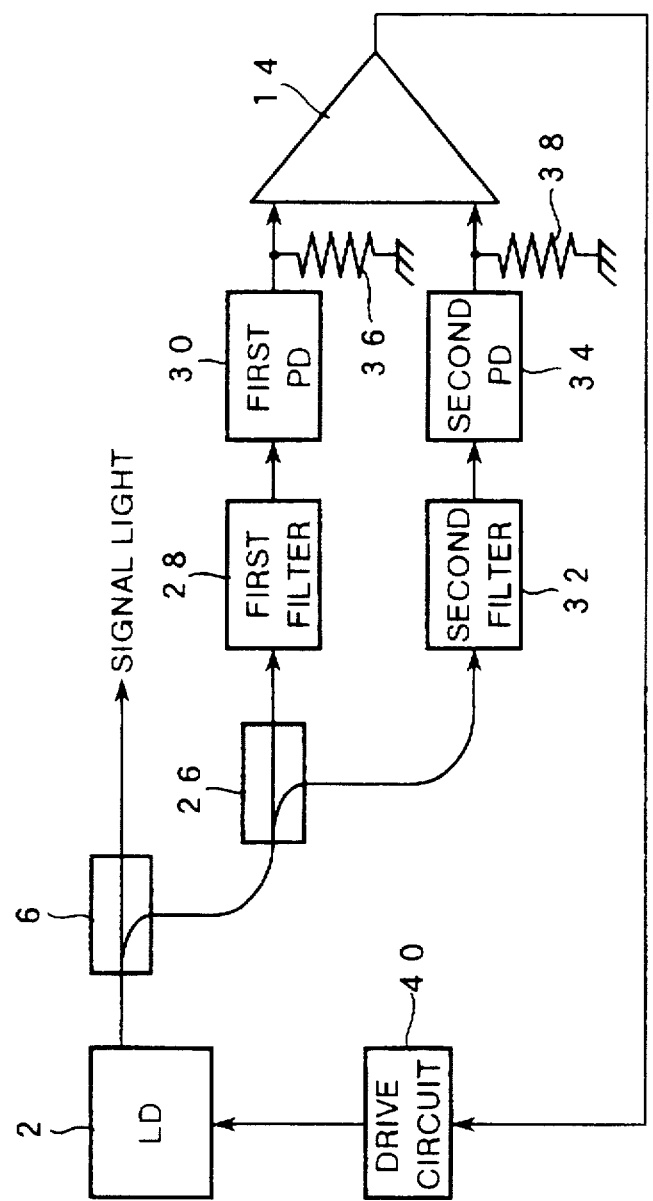
Figure 9:
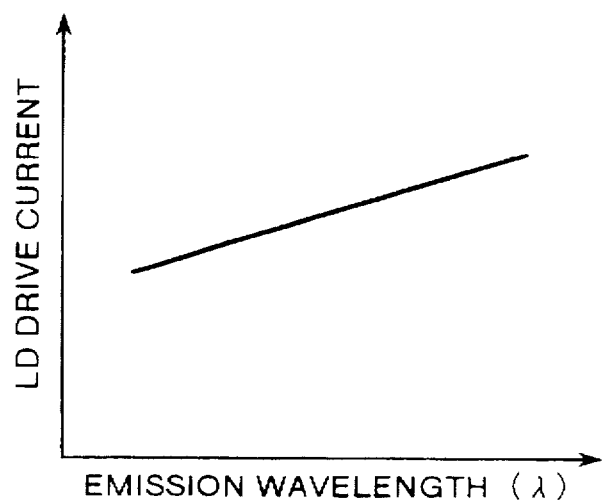
Figure 10:
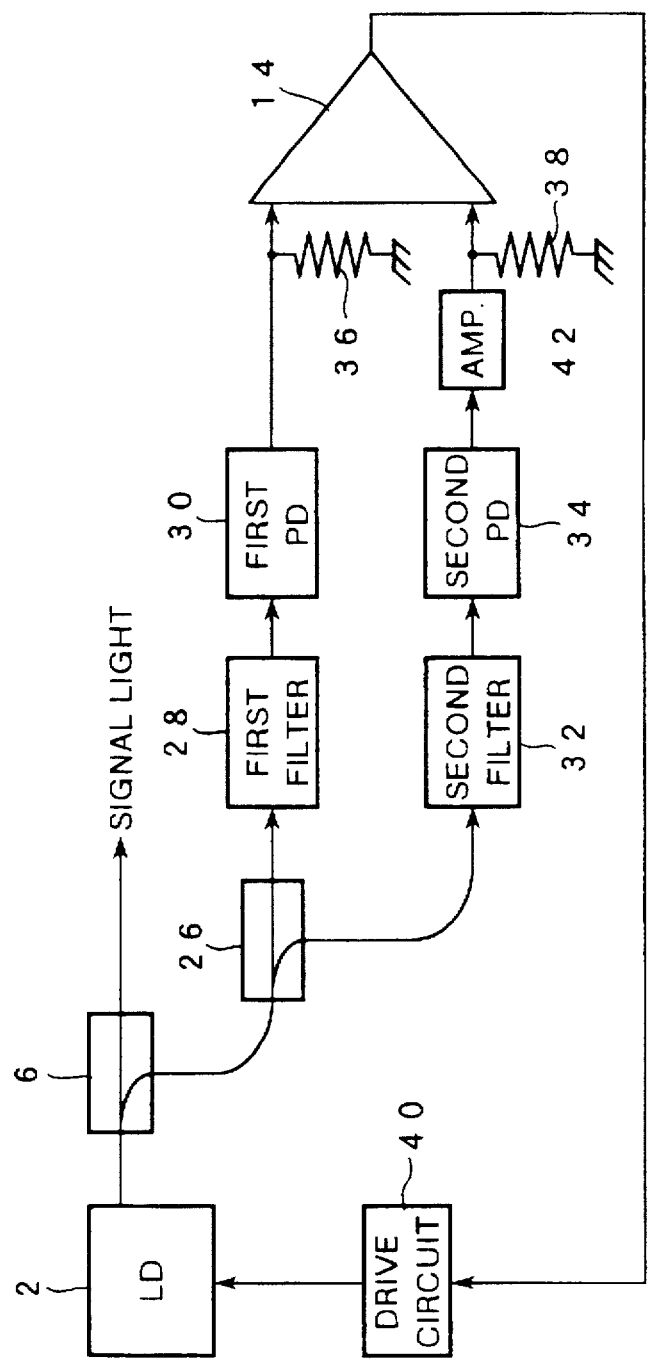
Figure 11:
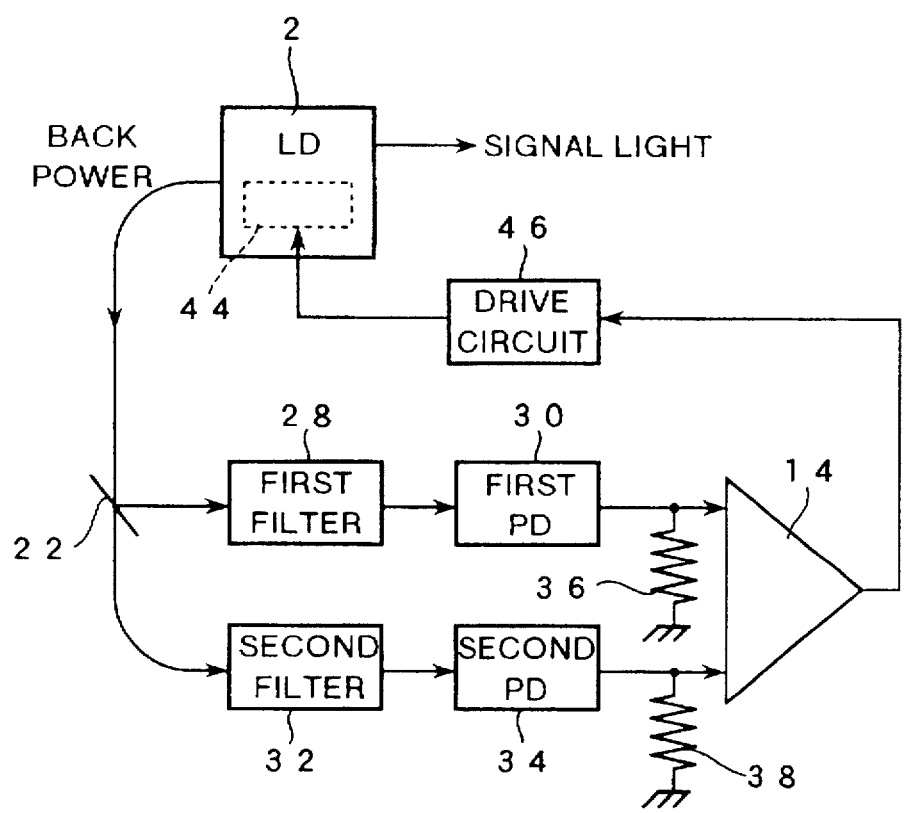
Figure 12:
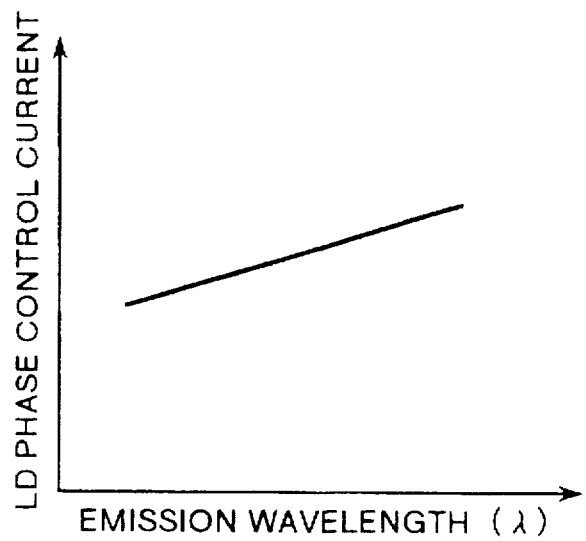

FIG. 7 is a graph showing the relation between emission wavelength and detection output after pass of light through two optical filters;

FIG. 8 is a block diagram of a fourth preferred embodiment of the present invention;

FIG. 9 is a graph showing the relation between emission wavelength and LD drive current;

FIG. 10 is a block diagram of a fifth preferred embodiment of the present invention;

FIG. 11 is a block diagram of a sixth preferred embodiment of the present invention; and FIG. 12 is a graph showing the relation between emission wavelength and LD phase control current.

DESCRIPTION OF THE PREFERRED EMBODIMENTS

Figure 1:
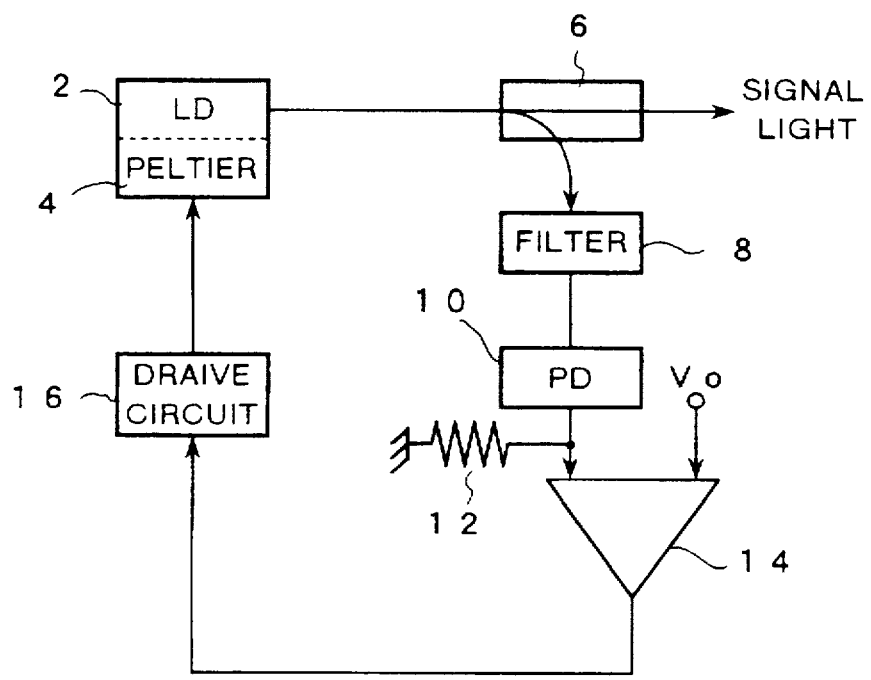
FIG. 1 is a block diagram of a first preferred embodiment of the present invention.

Some preferred embodiments of the present invention will now be described in detail with reference to the drawings. In the following description of the preferred embodiments, substantially the same components will be denoted by the same reference numerals throughout the drawings. Referring to FIG. 1, there is shown a block diagram of a first preferred embodiment of the present invention. A laser diode (LD) 2 is mounted on a Peltier element 4. The Peltier element 4 absorbs or generates heat according to a direction of current flowing therein to control the temperature of the LD 2.

Figure 2:
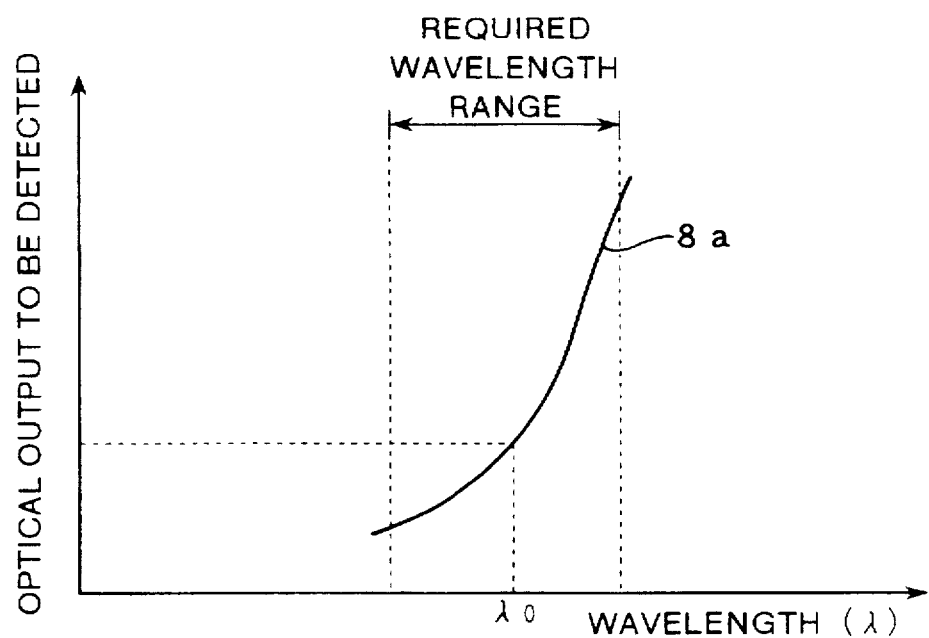
FIG. 2 is a graph showing the relation between emission wavelength and detection output after pass of light through an optical filter.

Signal light emitted from the LD 2 is branched into two components by an optical coupler 6. A branching ratio by the optical coupler 6 may be appropriately set. One of the two components obtained by the optical coupler is passed through an optical filter 8, and is then detected by a photodiode (PD) 10. The optical filter 8 has a transmission characteristic as shown in FIG. 2, for example. Referring to FIG. 2, the optical filter 8 has a portion 8a whose transmittance continuously increases with an increase in wavelength in a required wavelength range including a target emission wavelength $\lambda_0$ of the LD 2. Alternatively, the optical filter 8 may have a portion whose transmittance continuously decreases with an increase in wavelength in such a required wavelength range. Accordingly, the optical filter 8 may be selected from a band-pass filter, a low-pass filter, and a high-pass filter.

Optical power of the light passed through the optical filter 8 is detected as a current value by the PD An output current from the PD 10 is converted into a voltage by a pull-down resistor 12, and is then input into a comparator 14. The comparator 14 compares the output voltage from the PD 10 and a reference voltage $V_0$, and then inputs a voltage difference therebetween into a drive circuit 16 for driving the Peltier element 4. That is, the Peltier element 4 is driven so that the output from the comparator 14 becomes 0V under the closed-loop control shown in FIG. 1.

Figure 3:
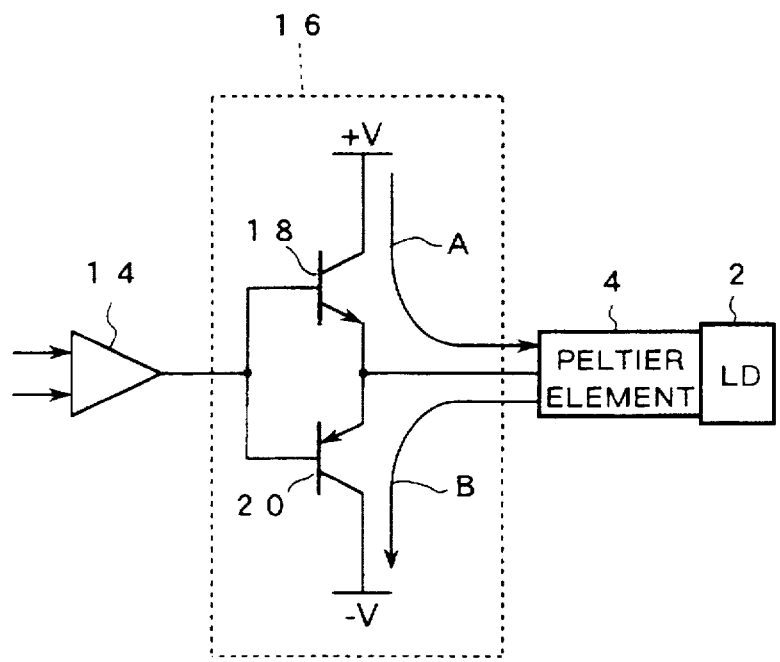
FIG. 3 is a diagram showing a drive circuit for driving a Peltier element.
Figure 4:
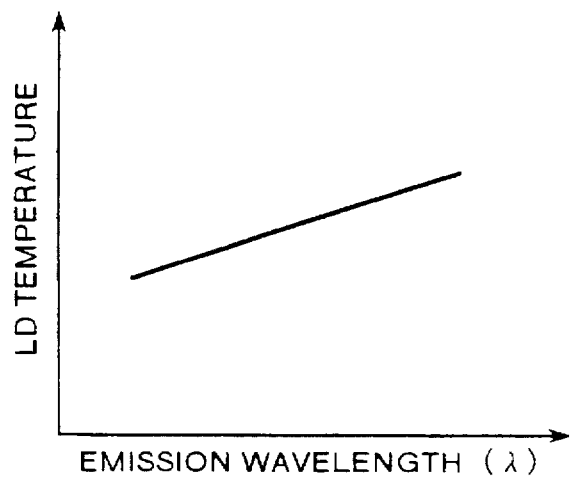
FIG. 4 is a graph showing the relation between emission wavelength and LD temperature.

Referring to FIG. 3, the details of the drive circuit 16 are shown. The drive circuit 16 is configured by connecting in series a transistor 18 whose collector is connected to a positive power supply +V and a transistor 20 whose collector is connected to a negative power supply –V. The output voltage from the comparator 14 is input into the bases of the transistors 18 and 20, and the emitters of the transistors 18 and 20 are connected to the Peltier element 4. As apparent from FIG. 2, the target emission wavelength $\lambda_0$ of the LD 2 is determined by an optical output detected by the PD 10. As shown in FIG. 4, the emission wavelength and the temperature of the LD 2 are in a substantially proportional relation.

When the output voltage from the PD 10 is higher than the reference voltage $V_0$, it is apparent from FIG. 2 that the emission wavelength of the LD 2 is longer than the target emission wavelength $\lambda_0$, so that it is apparent from the relation of FIG. 4 that the emission wavelength of the LD 2 can be controlled by reducing the temperature of the LD 2. That is, since the output from the comparator 14 is positive in this case, the transistor 18 goes on in the drive circuit 16 shown in FIG. 3 to make a current flow in a direction shown by an arrow A to the Peltier element 4, so that the Peltier element 4 absorbs heat. Accordingly, the LD 2 is cooled according to the output from the comparator 14, and the emission wavelength of the LD 2 is decreased or made shorter to approach the target wavelength.

Conversely, when the emission wavelength of the LD 2 is shorter than the target wavelength, the output from the comparator 14 becomes negative. Accordingly, the transistor 20 goes on to make a current flow in a direction shown by an arrow B in FIG. 3 to the Peltier element 4, so that the Peltier element 4 generates heat. Accordingly, the LD 2 is heated according to the output from the comparator 14, and the emission wavelength of the LD 2 is increased or made longer to approach the target wavelength. The above operation is repeated to control the emission wavelength of the LD 2 so that it comes to coincidence with the target wavelength.

Referring to FIG. 5, there is shown a block diagram of a second preferred embodiment of the present invention. In this preferred embodiment, back power of the LD 2 is utilized. The back power of the LD 2 is branched into two components by a semitransparent mirror 22. The reflected light from the semitransparent mirror 22 is input into the optical filter 8, and the light passed through the optical filter 8 is detected by the PD 10 like the first preferred embodiment shown in FIG. 1. The output voltage from the PD 10 and the reference voltage $V_0$ are compared in the comparator 14, and the Peltier element 4 is driven by the drive circuit 16 according to the voltage difference output from the comparator 14 like the first preferred embodiment. On the other hand, the transmitted light through the semitransparent mirror 22 is input into an automatic power control circuit (APC) 24, which then feedback-controls the output power of the LD 2 so that it becomes a predetermined level.

Figure 6:
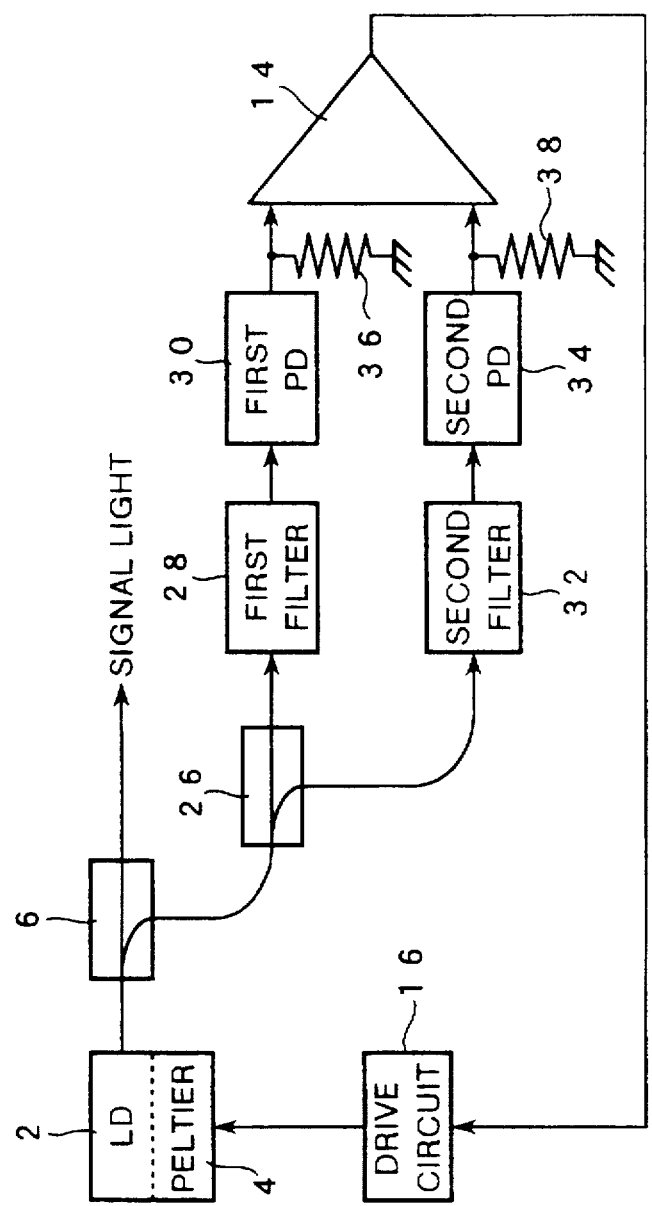
FIG. 6 is a block diagram of a third preferred embodiment of the present invention.

Referring to FIG. 6, there is shown a block diagram of a third preferred embodiment of the present invention. In this preferred embodiment, signal light emitted from the LD 2 is branched into two components by the optical coupler 6, and one of the two components is further branched into two components by an optical coupler 26. One of the two components obtained by the optical coupler 26 is passed through a first optical filter 28, and is then detected by a first photodiode (PD) 30. The other component from the optical coupler 26 is passed through a second optical filter 32, and is then detected by a second photodiode (PD) 34.

As shown in FIG. 7, the first optical filter 28 has a portion 28a whose transmittance continuously increases with an increase in wavelength, whereas the second optical filter 32 has a portion 32a whose transmittance continuously decreases with an increase in wavelength. The relation in transmission characteristic between the first and second optical filters 28 and 32 may be opposite to the above-mentioned relation. Accordingly, the first and second optical filters 28 and 32 may be selected from a band-pass filter, a low-pass filter, and a high-pass filter.

The output from the first PD 30 is converted into a voltage by a pull-down resistor 36, and is then input into the comparator 14. Similarly, the output from the second PD 34 is converted into a voltage by a pull-down resistor 38, and is then input into the comparator 14. The comparator 14 compares the outputs from the first PD 30 and the second PD 34 to supply a voltage difference between the two outputs to the drive circuit 16. Then, the drive circuit 16 drives the Peltier element 4 according to the output from the comparator 14. That is, when the output from the first PD 30 is larger than the output from the second PD 34, it is apparent from FIG. 7 that the emission wavelength of the LD 2 is longer than the target wavelength $\lambda_0$. Accordingly, the transistor 18 in the drive circuit 16 as shown in FIG. 3 goes on to make a current flow in the direction of the arrow A to the Peltier element 4, thus driving the Peltier element 4 so that it absorbs heat. As a result, the LD 2 is cooled according to the output from the comparator 14 and is controlled so that the emission wavelength of the LD 2 approaches the target wavelength.

Conversely, when the emission wavelength of the LD 2 is shorter than the target wavelength $\lambda_0$, the output from the comparator 14 is negative, and the transistor 20 in the drive circuit 16 as shown in FIG. 3 goes on to make a current flow in the direction of the arrow B to the Peltier element 4, thus driving the Peltier element 4 so that it generates heat. As a result, the LD 2 is heated according to the output from the comparator 14 and is controlled so that the emission wavelength of the LD 2 approaches the target wavelength. As a modification of the third preferred embodiment shown in FIG. 6, the back power of the LD 2 may be utilized as monitoring light as described in the second preferred embodiment shown in FIG. 5. In this case, the optical coupler 6 may be omitted.

Referring to FIG. 8, there is shown a block diagram of a fourth preferred embodiment of the present invention. In this preferred embodiment, a drive current to the LD 2 is controlled by a drive circuit 40 according to the output from the comparator 14. That is, the emission wavelength of the LD 2 and the drive current are in substantially proportional relation as shown in FIG. 9. Therefore, when the output from the comparator 14 is positive, it is apparent from FIG. 7 that the emission wavelength of the LD 2 is longer than the target wavelength $\lambda_0$, and accordingly the drive circuit 40 is controlled so that the drive current to the LD 2 is decreased.

Conversely, when the output from the comparator 14 is negative, it is apparent from FIG. 7 that the emission wavelength of the LD 2 is shorter than the target wavelength $\lambda_0$, and accordingly the drive circuit 40 is controlled so that the drive current to the LD 2 is increased. As a modification of the fourth preferred embodiment shown in FIG. 8, the back power of the LD 2 may be utilized as monitoring light as described in the second preferred embodiment shown in FIG. 5. In this case, the optical coupler 6 may be omitted.

Referring to FIG. 10, there is shown a block diagram of a fifth preferred embodiment of the present invention. This preferred embodiment is applied to the case where the target wavelength $\lambda_0$ does not lie on the intersection between the two curves 28a and 32a shown in FIG. 7. For example, when the target wavelength $\lambda_0$ is shifted from the intersection between the two curves 28a and 32a toward a longer wavelength, the output from the second PD 34 is amplified with a given magnification by an amplifier 42. Then, the drive current to the LD 2 is controlled so that when the emission wavelength of the LD 2 comes to coincidence with the target wavelength $\lambda_0$, output from the comparator 14 becomes 0, thus stabilizing the emission wavelength of the LD 2.

Conversely, when the target wavelength $\lambda_0$ is shifted from the intersection between the two curves 28a and 32a toward a shorter wavelength as viewed in FIG. 7, the output from the first PD 30 is amplified. Further, the outputs from the first PD 30 and the second PD 34 may be amplified. As a modification of the fifth preferred embodiment shown in FIG. 10, the back power of the LD 2 may be utilized as monitoring light like the second preferred embodiment shown in FIG. 5. In this case, the optical coupler 6 may be omitted.

Referring to FIG. 11, there is shown a block diagram of a sixth preferred embodiment of the present invention. In this preferred embodiment, a drive current supplied to a phase control region 44 in the LD 2 is feedback-controlled according to the power of monitoring light. The back power of the LD 2 is utilized as the monitoring light. The emission wavelength of the LD 2 can be changed by supplying a phase control current to the phase control region 44. The emission wavelength of the LD 2 and the phase control current to the phase control region 44 are in a substantially proportional relation as shown in FIG. 12.

Accordingly, when the output from the comparator 14 is positive, it is apparent from FIG. 7 that the emission wavelength of the LD 2 is longer than the target wavelength $\lambda_0$, and therefore a drive circuit 46 is controlled so that the phase control current is decreased. Accordingly, the emission wavelength of the LD 2 is decreased so as to approach the target wavelength $\lambda_0$. Conversely, when the output from the comparator 14 is negative, it is apparent from FIG. 7 that the emission wavelength of the LD 2 is shorter than the target wavelength $\lambda_0$, and therefore the drive circuit 46 is controlled so that the phase control current is increased. Accordingly, the emission wavelength of the LD 2 is increased so as to approach the target wavelength $\lambda_0$. As a modification of the sixth preferred embodiment, the forward power of the LD 2 may be utilized as monitoring light as described in the fourth preferred embodiment shown in FIG. 8.

As described above, according to the present invention, the emission wavelength of the laser diode is monitored to thereby make the emission wavelength coincide with the target wavelength. Accordingly, the emission wavelength of the laser diode can be stabilized.

What is claimed is:

1. An optical wavelength stabilizing system comprising:

a laser diode for emitting signal light;

a Peltier element for controlling a temperature of said laser diode;

a driving means for driving said Peltier element;

an optical branching means for branching said signal light into two components;

an optical filter inserted in an optical path of one of said two components obtained by said optical branching means, said optical filter having a portion whose transmittance changes with changes in wavelength;

a photodetector for detecting said one component passed through said portion of said optical filter;

a converting means for converting a current output from said photodetector into a voltage; and a comparator for comparing said voltage obtained by said converting means and a reference voltage to output a voltage difference between said voltage and said reference voltage to said driving means.

2. An optical wavelength stabilizing system comprising:

a laser diode for emitting signal light and back power light;

a Peltier element for controlling a temperature of said laser diode;

a driving means for driving said Peltier element;

an optical filter inserted in an optical path of said back power light, said optical filter having a portion whose transmittance changes with changes in wavelength;

a photodetector for detecting said back power light passed through said portion of said optical filter;

a converting means for converting a current output from said photodetector into a voltage; and a comparator for comparing said voltage obtained by said converting means and a reference voltage to output a voltage difference between said voltage and said reference voltage to said driving means.

3. An optical wavelength stabilizing system according to claim 2, further comprising an optical branching means for branching said back power light into two components, and an automatic power control circuit for controlling output power of said laser diode according to one of said two components obtained by said optical branching means.

4. An optical wavelength stabilizing system comprising:

a laser diode for emitting signal light;

a Peltier element for controlling a temperature of said laser diode;

a driving means for driving said Peltier element;

a first optical branching means for branching said signal light into two components;

a second optical branching means for branching one of said two components obtained by said first optical branching means into two components;

a first optical filter inserted in an optical path of one of said two components obtained by said second optical branching means, said first optical filter having a portion whose transmittance increases with an increase in wavelength;

a second optical filter inserted in an optical path of the other of said two components obtained by said second optical branching means, said second optical filter having a portion whose transmittance decreases with an increase in wavelength;

a first photodetector for detecting said one component passed through said portion of said first optical filter;

a second photodetector for detecting said other component passed through said portion of said second optical filter; and a comparator for comparing an output from said first photodetector and an output from said second photodetector to output a differential signal to said driving means.

5. An optical wavelength stabilizing system according to claim 4, further comprising an amplifying means for amplifying at least one of said outputs from said first and second photodetectors.

6. An optical wavelength stabilizing system comprising:

a laser diode for emitting signal light and back power light;

a Peltier element for controlling a temperature of said laser diode;

a driving means for driving said Peltier element;

an optical branching means for branching said back power light into two components;

a first optical filter inserted in an optical path of one of said two components obtained by said optical branching means, said first optical filter having a portion whose transmittance increases with an increase in wavelength;

a second optical filter inserted in an optical path of the other of said two components obtained by said optical branching means, said second optical filter having a portion whose transmittance decreases with an increase in wavelength;

a first photodetector for detecting said one component passed through said portion of said first optical filter;

a second photodetector for detecting said other component passed through said portion of said second optical filter; and a comparator for comparing an output from said first photodetector and an output from said second photodetector to output a differential signal to said driving means.

7. An optical wavelength stabilizing system comprising:

a laser diode for emitting signal light;

a driving means for driving said laser diode;

a first optical branching means for branching said signal light into two components;

a second optical branching means for branching one of said two components obtained by said first optical branching means into two components;

a first optical filter inserted in an optical path of one of said two components obtained by said second optical branching means, said first optical filter having a portion whose transmittance increases with an increase in wavelength;

a second optical filter inserted in an optical path of the other of said two components obtained by said second optical branching means, said second optical filter having a portion whose transmittance decreases with an increase in wavelength;

a first photodetector for detecting said one component passed through said portion of said first optical filter;

a second photodetector for detecting said other component passed through said portion of said second optical filter; and a comparator for comparing an output from said first photodetector and an output from said second photodetector to output a differential signal to said driving means.

8. An optical wavelength stabilizing system comprising:

a laser diode for emitting signal light and back power light;

a driving means for driving said laser diode;

an optical branching means for branching said back power light into two components;

a first optical filter inserted in an optical path of one of said two components obtained by said optical branching means, said first optical filter having a portion whose transmittance increases with an increase in wavelength;

a second optical filter inserted in an optical path of the other of said two components obtained by said optical branching means, said second optical filter having a portion whose transmittance decreases with an increase in wavelength;

a first photodetector for detecting said one component passed through said portion of said first optical filter;

a second photodetector for detecting said other component passed through said portion of said second optical filter; and a comparator for comparing an output from said first photodetector and an output from said second photodetector to output a differential signal to said driving means.

9. An optical wavelength stabilizing system comprising:

a laser diode for emitting signal light, said laser diode having a phase control region;

a driving means for driving said phase control region;

a first optical branching means for branching said signal light into two components;

a second optical branching means for branching one of said two components obtained by said first optical branching means into two components;

a first optical filter inserted in an optical path of one of said two components obtained by said second optical branching means, said first optical filter having a portion whose transmittance increases with an increase in wavelength;

a second optical filter inserted in an optical path of the other of said two components obtained by said second optical branching means, said second optical filter having a portion whose transmittance decreases with an increase in wavelength;

a first photodetector for detecting said one component passed through said portion of said first optical filter;

a second photodetector for detecting said other component passed through said portion of said second optical filter; and a comparator for comparing an output from said first photodetector and an output from said second photodetector to output a differential signal to said driving means.

10. An optical wavelength stabilizing system comprising:

a laser diode for emitting signal light and back power light, said laser diode having a phase control region;

a driving means for driving said phase control region;

an optical branching means for branching said back power light into two components;

a first optical filter inserted in an optical path of one of said two components obtained by said optical branching means, said first optical filter having a portion whose transmittance increases with an increase in wavelength;

a second optical filter inserted in an optical path of the other of said two components obtained by said optical branching means, said second optical filter having a portion whose transmittance decreases with an increase in wavelength;

a first photodetector for detecting said one component passed through said portion of said first optical filter;

a second photodetector for detecting said other component passed through said portion of said second optical filter; and a comparator for comparing an output from said first photodetector and an output from said second photodetector to output a differential signal to said driving means.

\* \* \* \* \*